(12) United States Patent
Takeya et al.

(10) Patent No.: US 6,524,882 B2
(45) Date of Patent: Feb. 25, 2003

(54) METHOD OF PRODUCING P-TYPE NITRIDE BASED III-V COMPOUND SEMICONDUCTOR AND METHOD OF FABRICATING SEMICONDUCTOR DEVICE USING THE SAME

(75) Inventors: Motonobu Takeya, Miyagi (JP); Satoshi Taniguchi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/824,238

(22) Filed: Apr. 3, 2001

(65) Prior Publication Data

US 2001/0055871 A1 Dec. 27, 2001

(30) Foreign Application Priority Data

Apr. 4, 2000 (JP) .......................... 2000-102622
Aug. 17, 2000 (JP) .......................... 2000-247844

(51) Int. Cl.⁷ .............................................. H01L 21/00
(52) U.S. Cl. ........................................ 438/93; 438/933
(58) Field of Search ..................... 439/46, 93, 438, 439/518, 775, 776, 777, 779, 788, 930, 933

(56) References Cited

U.S. PATENT DOCUMENTS 5,834,326 A    11/1998    Miyachi ..................... 438/29
5,966,397 A *  10/1999    Hirata ........................ 372/46
6,064,082 A *   5/2000    Kawai et al. ................ 257/192
6,218,677 B1 *  4/2001    Broekaert ................... 257/22

FOREIGN PATENT DOCUMENTS

| JP | 05-183189 | 3/1989 |
| JP | 08-88432  | 4/1996 |
| JP | 2540791   | 7/1996 |
| JP | 09-162442 | 6/1997 |
| JP | 10-242578 | 9/1998 |

* cited by examiner

Primary Examiner—David Nelms
Assistant Examiner—David Nhu
(74) Attorney, Agent, or Firm—Rader, Fishman & Grauer PLLC; Ronald P. Kananen, Esq.

(57) ABSTRACT

A nitride based III–V compound semiconductor doped with a p-type impurity is formed on a substrate made from sapphire. The substrate is then placed between a pair of RF electrodes, and a radio frequency field is applied between the RF electrodes. With this operation, electrons present in the compound semiconductor attack the bonding between the p-type impurity and hydrogen, to cut the bonding. The hydrogen atoms thus dissociated are released from the compound semiconductor, to thereby activate the p-type impurity. In this case, it is not required to heat the compound semiconductor by a heater or the like.

6 Claims, 5 Drawing Sheets

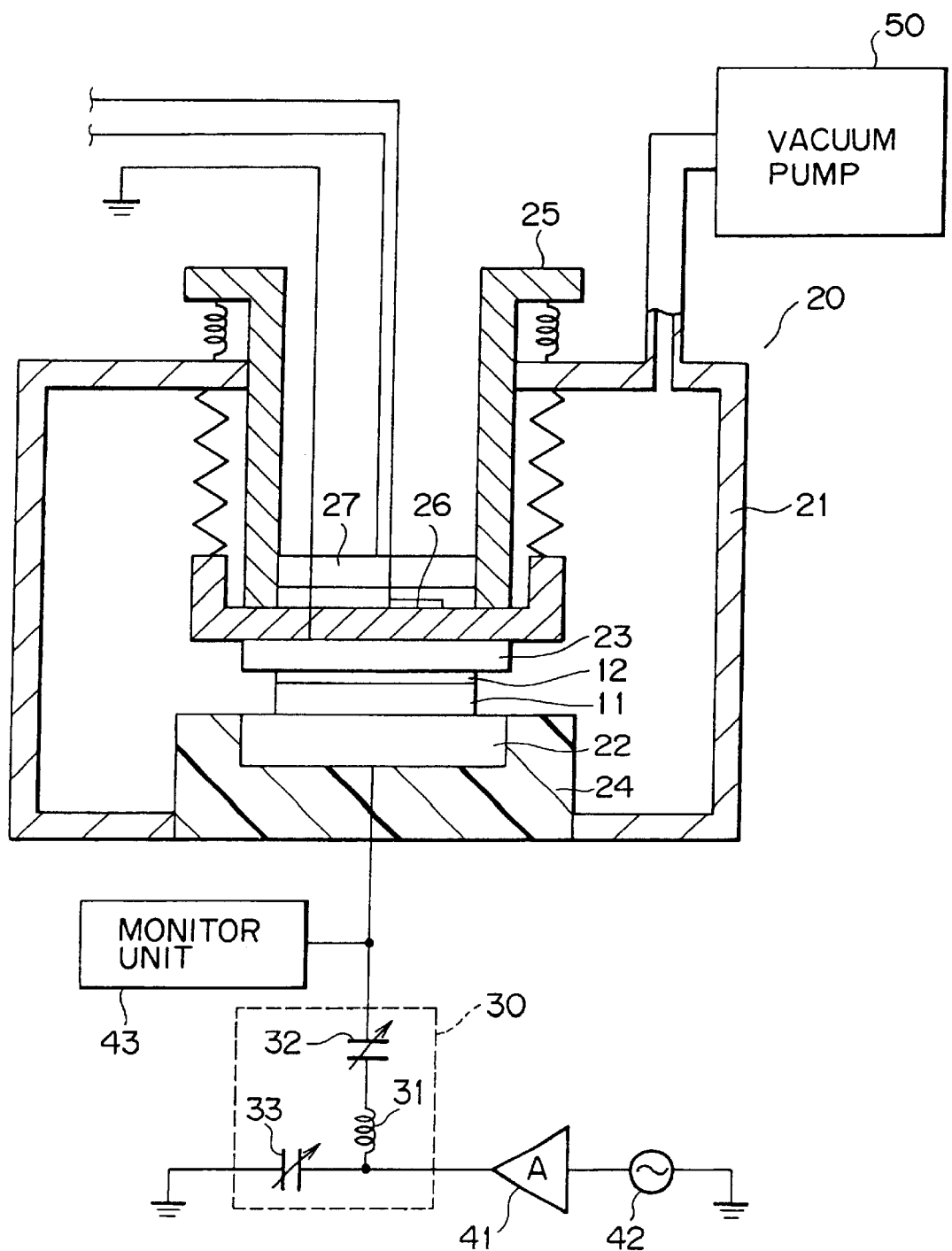
F I G. 2

METHOD OF PRODUCING P-TYPE NITRIDE BASED III-V COMPOUND SEMICONDUCTOR AND METHOD OF FABRICATING SEMICONDUCTOR DEVICE USING THE SAME

BACKGROUND OF THE INVENTION

1. Field of the Invention

The present invention relates to a method of producing a p-type nitride based III–V compound semiconductor, which is intended to activate a p-type impurity by applying an electric field to the semiconductor, and a method of fabricating a semiconductor device using the semiconductor.

2. Description of the Related Art

A nitride based III–V compound semiconductor, such as GaN, AlGaN compound crystal, and AlInGaN compound crystal have been used as base materials for light emitting devices allowing light emission in a range from a visual region to an ultraviolet region, or as base materials for electronic devices. In particular, a light emitting diode (LED) using a nitride based III–V compound semiconductor has become commercially practical and a focus of attention. Further, a semiconductor laser (LD) using a nitride based III–V compound semiconductor has been reported as a useful laser and has been used particularly as a light source of optical disk drives.

From the practical viewpoint of devices such as LEDs and LDs, it is important to produce a nitride based III–V compound semiconductor having a quality being high enough to be usable as a base material of the devices. In particular, to fabricate optical devices allowing effective current-carrying, it has been required to produce p-type and n-type nitride based III–V compound semiconductors having high qualities.

A nitride based III–V compound semiconductor is generally produced by epitaxial growth of the semiconductor on a substrate by a MOCVD (Metal Organic Chemical Vapor Deposition) process or the like. In this case, an n-type nitride based III–V compound semiconductor having a high quality can be easily produced by epitaxial growth with the addition of an n-type impurity such as silicon (Si). On the contrary, a p-type nitride based III–V compound semiconductor having a high quality cannot be produced only by epitaxial growth with the addition of a p-type impurity such as magnesium (Mg), and to enhance the quality of such a p-type semiconductor, the p-type impurity is required to be activated.

Methods of activating a p-type impurity have been variously proposed. For example, Japanese Patent No. 2540791 has disclosed a method of activating a p-type impurity by growing a nitride based III–V compound semiconductor by the MOCVD process, and annealing the semiconductor in an atmosphere substantially not containing hydrogen at a temperature of 400° C. or more; and Japanese Patent Laid-open No. Hei 9-162442 has disclosed a method of activating a p-type impurity by forming a pn-junction or pin-junction, and forming an electrostatic field across the junction.

The method disclosed in Japanese Patent No. 2540791, however, has the problems that since the atmosphere at the time of heating is limited, the degree of freedom of production is low, and that since the annealing must be performed at a high temperature of 600° C. or more for 10 to 20 min in order to activate the p-type impurity sufficiently from the practical viewpoint, nitrogen may be released from the nitride based III–V compound semiconductor during the annealing, and therefore, a protective film for preventing the release of nitrogen must be formed. According to this method, there occurs a further problem that, in the step of fabricating a light emitting device in which laser annealing is performed for activation of a p-type impurity, since the p-type semiconductor is left in a high temperature state for 10 to 20 min, elements of an active layer are diffused to collapse the steepness of a superlattice structure or the p-type impurity in the p-type semiconductor is diffused to enter the active layer, thereby deteriorating the light emission characteristic. The method disclosed in Japanese Patent Laid-open No. Hei 9-162442 has a problem that since electrodes must be formed on both the p-side and n-side for forming an electrostatic field across the pn-junction or pin-junction, such a method is unstable for mass-production.

SUMMARY OF THE INVENTION

An object of the present invention is to provide a method of producing a p-type nitride based III–V compound semiconductor, which is capable of simply activating a p-type impurity, and a method of fabricating a semiconductor device using the compound semiconductor thus produced.

To achieve the above object, according to an aspect of the present invention, there is provided a method of producing a p-type nitride based III–V compound semiconductor, including the steps of: preparing a nitride based III–V compound semiconductor containing at least one kind selected from group IIIB elements, at least nitrogen selected from group VB elements, and a p-type impurity; and applying a radio frequency field to the nitride based III–V compound semiconductor thus prepared.

According to another aspect of the present invention, there is provided a method of fabricating a semiconductor device, including the step of: forming a p-type nitride based III–V compound semiconductor by preparing a nitride based III–V compound semiconductor containing at least one kind selected from group IIIB elements, at least nitrogen selected from group VB elements, and a p-type impurity, and applying a radio frequency field to the nitride based III–V compound semiconductor thus prepared.

In the method of producing a p-type nitride based III–V compound semiconductor according to the present invention and a method of fabricating a semiconductor device according to the present invention, since a p-type impurity is activated by applying a radio frequency field, the carrier density can be increased.

BRIEF DESCRIPTION OF THE DRAWINGS

FIG. 2 is a schematic view showing a configuration of an impurity activation system used for the production method according to the embodiment of the present invention;

DETAILED DESCRIPTION OF THE PREFERRED EMBODIMENT

Hereinafter, a preferred embodiment of the present invention will be described with reference to the accompanying drawings.

Figure 1:
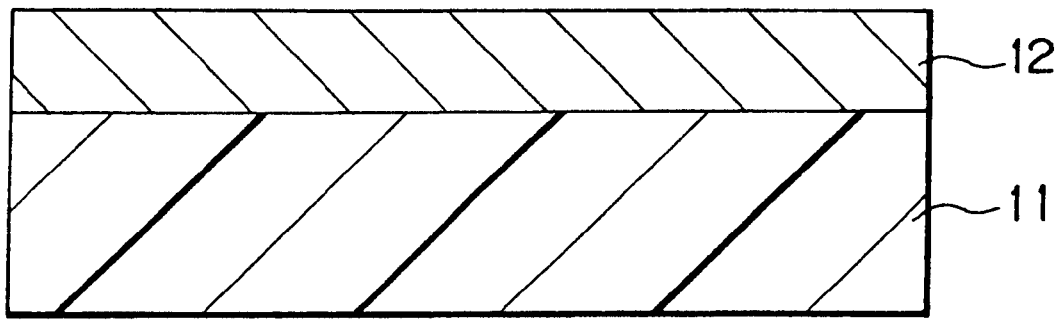
FIG. 1 is a sectional view illustrating one step of producing a p-type nitride based III–V compound semiconductor according to one embodiment of the present invention.

FIG. 1 is a schematic view illustrating one step of producing a p-type nitride based III–V compound semiconductor according to one embodiment of the present invention. According to a method of producing a p-type nitride based III–V compound semiconductor of the present invention, there is produced a p-type nitride based III–V compound semiconductor containing: at least one kind selected from group IIIB elements in the short form of the periodic table, which include gallium (Ga), aluminum (Al), indium (In), and boron (B); at least nitrogen selected from group VB elements in the short-form of the periodic table, which include nitrogen (N), arsenic (As), and phosphorus (P); and a p-type impurity. As the p-type impurity, there may be used at least one kind selected from a group consisting of magnesium (Mg), zinc (Zn), carbon (C), beryllium (Be), calcium (Ca), barium (Ba), and cadmium (Cd). In particular, magnesium is preferably used as the p-type impurity. The p-type nitride based III–V compound semiconductor produced by the production method of the present invention is represented by p-type GaN, p-type InN, p-type AlN, p-type AlGaN compound crystal, p-type GaInN compound crystal, or p-type AlInGaN compound crystal.

According to this embodiment, as shown in FIG. 1, a nitride based III–V compound semiconductor 12 containing at least one kind selected from the above-described group IIIB elements, at least nitrogen selected from the above-described group VB elements, and magnesium as a p-type impurity is grown on a c-plane of a substrate 11 made from sapphire ($\alpha$-$Al_2O_3$) by an MOCVD process or the like.

Raw materials used for growing the nitride based III–V compound semiconductor 12 by the MOCVD process are as follows, namely: trimethyl gallium (($CH_3)_3Ga$) is used as a source gas of gallium; trimethyl aluminum (($CH_3)_3Al$) is used as a source gas of aluminum; trimethyl indium (($CH_3)_3In$) is used as a source gas of indium; trimethyl boron (($CH_3)_3B$) is used as a source gas of boron; ammonia ($NH_3$) is used as a source gas of nitrogen; and bis (cyclopentadienyl) magnesium (($C_5H_5)_2Mg$) is used as a source gas of magnesium.

The nitride based III–V compound semiconductor 12 thus grown contains hydrogen atoms in a concentration of about $1 \times 10^{19}$ pieces/$cm^3$ to $1 \times 10^{20}$ pieces/$cm^3$. The hydrogen atoms, which have been produced by decomposition of ammonia as a source gas of nitrogen during the MOCVD process, are liable to be bonded to the p-type impurity.

The p-type impurity contained in the nitride based III–V compound semiconductor 12 is activated by using the following impurity activation system. FIG. 2 shows a schematic structure of an impurity activation system used for the present invention. The impurity activation system includes a chamber 20 having a chamber main body 21. A pair of RF (Radio Frequency) electrodes 22 and 23, between which an RF voltage is to be applied, are disposed in the chamber main body 21. The RF electrode 22 is fixed to a supporting base 24, and the RF electrode 23 is supported by a liftable supporting member 25.

On the side RF electrode 23 of the opposed to the RF electrode 22, of the RF electrode 23, a thermocouple 26 is provided in a closely contact state, and further a heating mechanism such as a heater 27 is provided. The thermocouple 26 and the heater 27 respectively are connected to power sources (not shown). An RF generator 42 is connected to the RF electrode 22 via an impedance matching unit 30 and an amplifier 41. The impedance matching unit 30 includes a coil 31 and variable capacitors 32 and 33. The RF generator 42 generates a radio frequency in a range of 100 kHz to 400 MHz. The radio frequency thus generated is amplified at a specific level by the amplifier 41. In addition, the radio frequency amplified by the amplifier 41 is monitored by a monitor unit 43.

A vacuum pump 50 and a pressure device (not shown) are connected to the chamber 20 for adjusting the inner pressure and atmosphere in the chamber main body 21.

In this embodiment, the substrate 11 on which the nitride based III–V compound semiconductor 12 has been formed is placed between the RF electrodes 22 and 23, and the position of the RF electrode 23 is adjusted by movement of the supporting member 25 in such a manner that the RF electrode 23 is brought into contact with the nitride based III–V compound semiconductor 12. After that, an RF voltage is applied between the RF electrodes 22 and 23, to generate an RF field in the chamber 20, thereby applying the RF field to the nitride based III–V compound semiconductor 12. With this operation, hydrogen contained in the nitride based III–V compound semiconductor 12 is released therefrom, with a result that the p-type impurity is activated.

Such activation of the p-type impurity may be conceived to be based on the following principle. When an RF field is applied to the nitride based III–V compound semiconductor 12, electrons present in the nitrogen based III–V compound semiconductor 12 attack the bonding between the p-type impurity and hydrogen to cut the bonding. After the bonding between the p-type impurity and hydrogen has been cut, the hydrogen may be present in the nitride based III–V compound semiconductor 12 in the form of ions ($H^+$) or radicals ($H^+$). The hydrogen floating in the form of ions ($H^+$) is accelerated by the electric field and is released as hydrogen molecules ($H_2$) from a gap between the nitrogen based III–V compound semiconductor 12 and the RF electrode 23. The hydrogen floating in the form of radicals ($H^+$) collides with hydrogen ions ($H^+$) or electrons accelerated by the electric field. At this time, the kinetic energy of the hydrogen ions ($H^+$) or electrons is transmitted to the hydrogen radicals ($H^+$). Accordingly, the diffusion of the hydrogen radicals ($H^+$) is promoted, with a result that the hydrogen in the form of radicals ($H^+$) is released as hydrogen molecules ($H_2$) from the gap between the nitrogen based III–V compound semiconductor 12 and the RF electrode 23.

On the contrary, even if not a RF field but an electrostatic field is applied to the nitride based III–V compound semiconductor 12, in the case of using the substrate 11 made from an insulating material such as sapphire, since any current does not flow in the substrate 11, plus ions and electrons in the nitride based III–V compound semiconductor 12 cancel the electric field, with a result that the effect of the electric field cannot be expected, that is, the hydrogen is not released and thereby the p-type impurity cannot be activated.

In the case of applying an RF field, the frequency of the RF field is preferably more than 0 Hz and not more than 100 GHz. This is because it is difficult to manufacture an impurity activation system capable of ensuring a radio frequency in a range of more than 100 GHz with a high output, and to realize desirable impedance matching for the radio frequency in the range of more than 100 GHz. The frequency of the RF field is preferably in a range of 10 kHz to 400 MHz, more preferably, 1 MHz to 40 MHz. If the frequency is too large, it is difficult to realize desirable impedance matching for the radio frequency, whereas if the frequency is too small, the number of electrons migrating in the nitrogen based III–V compound semiconductor 12 becomes small, with a result that it takes a lot of time to perform activation. The field strength is preferably in a range of 100 V/cm to 1.5 MV/cm. If the field strength is smaller than 100 V/cm, the energy required for accelerating electrons present in the nitride based III–V compound semiconductor 12 becomes small, with a result that the bonding between the p-type impurity and hydrogen cannot be cut, whereas, if the field strength is more than 1.5 MV/cm, the nitrogen based III–V compound semiconductor may be broken by the electric field.

The inner pressure of the chamber main body 21 may be set to either reduced pressure, a normal pressure, and an increased pressure, and the atmosphere of the chamber main body 21 may be set to an inert gas atmosphere, such as a nitrogen gas atmosphere, or atmospheric air. In the case of increasing the inner pressure of the chamber main body 21, the increased pressure is preferably in a range of $1 \times 10^6$ Pa (10 atm) or less. The reason for this is that it is difficult to manufacture an impurity activation system capable of withstanding the inner pressure increased to a value of $1 \times 10^6$ Pa (10 atm) or more. Further, in the case of reducing the inner pressure of the chamber main body 21, the reduced pressure atmosphere is preferably set to a vacuum atmosphere of $1 \times 10^{-2}$ Pa or less, particularly, an ultra-high vacuum atmosphere of $1 \times 10^{-3}$ Pa or less in order to prevent the occurrence of discharge and make the release of hydrogen easier.

An RF field with no bias may be applied to the nitride based III–V compound semiconductor 12; however, an RF field with a bias may be applied to the semiconductor 12 by making the RF electrode 23 on the semiconductor 12 side negative and the RF electrode 22 on the substrate 11 side positive. In this case, a self-bias may be generated by setting the atmosphere of the inside of the chamber main body 21 to an inert gas atmosphere and shifting the inner pressure from a value of $1 \times 10^{-2}$ Pa or more to atmospheric pressure, thereby generating a plasma, or a bias may be generated by controlling a voltage applied between the RF electrodes 22 and 23 by using a DC power source.

At the time of applying an RF field, the nitrogen based III–V compound semiconductor 12 may be heated by the heater 27 or may not be heated. The activation of a p-type impurity is not dependent on the heating of the semiconductor 12 so much. Additionally, if the semiconductor 12 is heated at the time of applying an RF field, the heating temperature is preferably set to be less than 400° C. If the heating temperature is equal to or more than 400° C., nitrogen is liable to be released from the nitrogen based III–V compound semiconductor 12 to degrade the crystallinity of the semiconductor 12. It is to be noted that the temperature measured by the thermocouple 26 is little changed even by applying an RF field and is substantially kept at the temperature heated by the heater 27.

With the above activation of the p-type impurity, the nitride based III–V compound semiconductor 12 becomes a p-type nitride based III–V compound semiconductor.

Next, a method of fabricating a semiconductor device, for example, a semiconductor laser by using the method of producing a p-type nitride based III–V compound semiconductor will be described.

Figure 3:
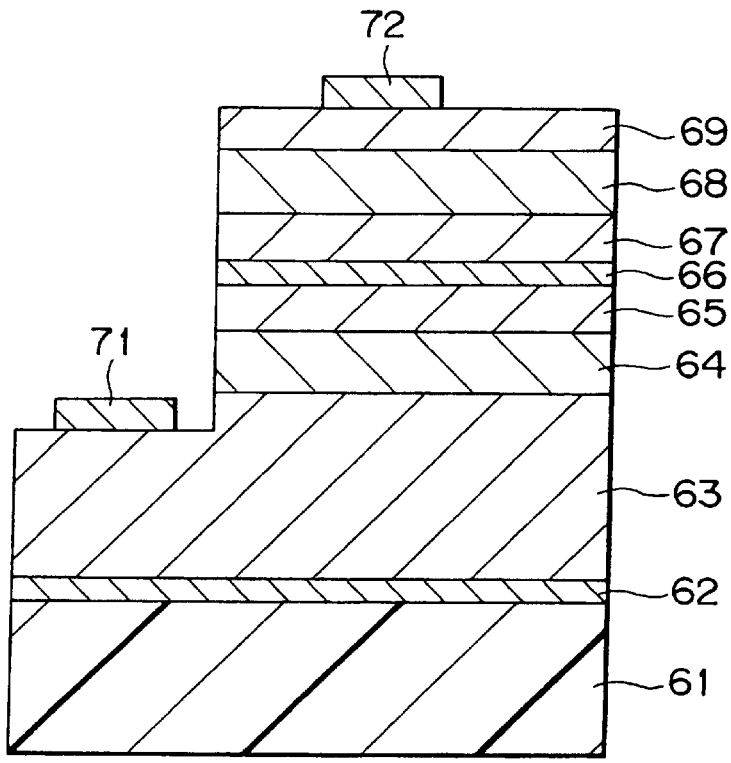
FIG. 3 is a sectional view showing a configuration of a semiconductor laser fabricated by the production method according to the embodiment of the present invention.

FIG. 3 shows a configuration of a semiconductor laser fabricated by using the method of producing a p-type nitride III–V compound semiconductor according to the embodiment of the present invention. First, an organic metal as a raw material of a specific element selected from group IIIB elements, ammonia as a raw material of nitrogen, an organic metal as a raw material of magnesium to be added as a p-type impurity, and monosilane ($SiH_4$) as a raw material of silicon to be added as an n-type impurity are prepared. Then, a substrate 61 made from sapphire is disposed in an MOCVD system (not shown), and a buffer layer 62 made from GaN is formed on a c-plane of the substrate 61 by the MOCVD process.

Subsequently, respective n-type nitride based III–V compound semiconductor layers are grown on the buffer layer 62 as follows: namely, an n-side contact layer 63 made from n-type GaN doped with silicon, an n-type cladding layer 64 made from n-type AlGaN compound crystal doped with silicon, and an n-type guide layer 65 made from n-type GaN doped with silicon are sequentially grown on the buffer layer 62. Then, an active layer 66 having a multiple quantum well structure composed of a stack of compound crystal layers made from $Ga_xIn_{1-x}N$ (x differs for each layer in a range of $1 \geq x \geq 0$) is grown on the n-type nitride based III–V compound semiconductor layers.

After the growth of the active layer 66, respective nitride based III–V compound semiconductor layers each containing a p-type impurity are grown on the active layer 66 as follows: namely, a p-type guide layer 67 made from GaN doped with magnesium, a p-type cladding layer 68 made from AlGaN compound crystal doped with magnesium, and a p-side contact layer 69 made from GaN doped with magnesium are sequentially grown on the active layer 66.

After that, the p-type impurities contained in the p-type guide layer 67, p-type cladding layer 68, and p-side contact layer 69 are activated by using the same impurity activation system as that shown in FIG. 2 in accordance with the above-described activation manner used for the method of producing a p-type nitride based III–V compound semiconductor, whereby the nitride based III–V compound semiconductor layers are converted into p-type nitride based compound semiconductor layers.

A resist pattern (not shown) having a stripe shape is formed on the p-type contact layer 69 at a position corresponding to a formation position of an n-side electrode 71 to be described later. Then, the p-type contact layer 69, the p-type cladding layer 68, the p-type guide layer 67, the active layer 66, the n-type guide layer 65, and the n-type cladding layer 64 are selectively removed in sequence by, for example, RIE (Reactive Ion Etching) using the resist pattern as a mask, to expose the n-side contact layer 63. Subsequently, the resist pattern (not shown) is removed, and the n-side electrode 71 is formed on the n-side contact layer 63 thus exposed. Further, a p-type electrode 72 is formed on the p-side contact layer 69. In this way, a semiconductor layer shown in FIG. 3 is produced.

According to the method of producing a p-type nitride based III–V compound semiconductor in this embodiment, hydrogen contained in a nitride based III–V compound semiconductor can be simply released by using a simple system, thereby simply activating a p-type impurity. That is to say, the activation of a p-type impurity can be easily carried out without the need for the provision of a protective film for preventing the release of nitrogen or provision of electrodes for injecting a current. Accordingly, the production method in this embodiment has proved to be excellent in mass-productivity, and, therefore, can be easily put into practical use.

According to the method described in Japanese Patent Laid-open No. Hei 9-162442, since electrodes for applying an electric field to a nitride based III–V compound semiconductor are formed, even if the electrodes are made from a hydrogen permeable metal, the diffusion and release of hydrogen are blocked by the electrodes. On the contrary, according to this embodiment, since hydrogen is released from a gap between the nitride based III–V compound semiconductor 12 and the RF electrode 23, it is possible to enhance the efficiency of releasing hydrogen.

Further, in this embodiment, the nitride based III–V compound semiconductor 12 is not required to be heated by the heating mechanism such as the heater 27, or if the semiconductor 12 is required to be heated, the heating effect can be sufficiently achieved by heating the semiconductor 12 at a temperature less than 400° C., and accordingly, it is possible to eliminate or shorten the heating time and cooling time and hence to enhance the production efficiency, and further, it is possible to eliminate the need for the provision of any member having a high heat resistance and hence to simplify the production apparatus. Further, since the semiconductor 12 is not required to be kept at a high temperature for a long time, it is possible to prevent the release of nitrogen, and hence to produce a p-type nitride based III–V compound semiconductor having a high crystallinity and a low resistance. Accordingly, a semiconductor device (semiconductor laser in this embodiment) produced by the production method is advantageous in improving device characteristics, more specifically, enhancing the light emission efficiency of the device and prolonging the service life thereof.

Figure 4:
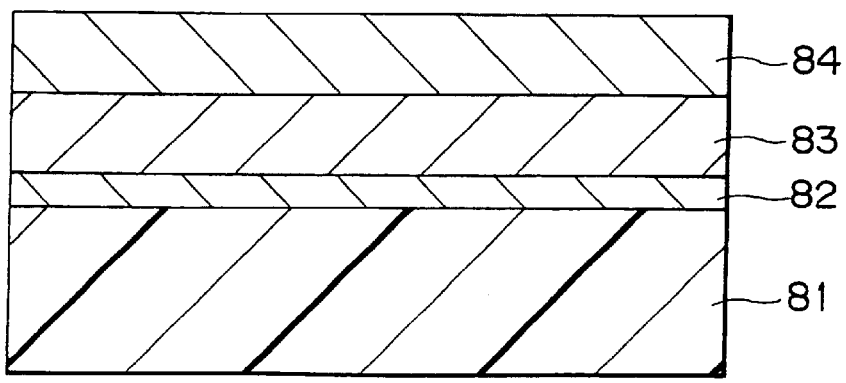
FIG. 4 is a sectional view showing a configuration of a sample produced in each Inventive Examples.

The present invention will be more clearly understood by way the following examples:

Each of samples in Inventive Examples 1 to 16 was produced, as shown in FIG. 4, by sequentially growing, on a c-plane of a substrate 81 made from sapphire, a buffer layer 82 made from undoped GaN having a thickness of 40 nm, an underlying layer 83 made from undoped GaN having a thickness of 1.0 $\mu$m, and a nitrogen based III–V compound semiconductor layer 84 doped with magnesium as a p-type impurity and having a thickness of 1.0 $\mu$m; and applying an RF field to the nitrogen based III–V compound semiconductor layer 84 under the following condition by using the same impurity activation system as that shown in FIG. 2, to activate the p-type impurity, thereby converting the nitride based III–V compound semiconductor layer 84 into a p-type nitride based III–V compound semiconductor layer.

The activation conditions for the samples were as follow: namely, the voltage, field strength, and application time were changed, as shown in Table 1, for the samples in Inventive Examples 1 to 16; the frequency of the RF field was set to 13.56 MHz, and the atmosphere of the inside of the chamber 20 was set to an ultra-high vacuum of $1\times10^{-3}$ Pa or less for the samples in Inventive Examples 1 to 16; and the nitrogen based III–V compound semiconductor 84 was heated to 300° C. by the heater 27 for the samples in Inventive Examples 1 to 12, and the heating by the heater 27 was not performed for the samples in Inventive Examples 13 to 16. The heating temperature was measured by the thermocouple 26. The value measured by the thermocouple 26 was little changed even by applying an RF field.

TABLE 1

| | Voltage (kV) | Field strength (kV/cm) | Application time (sec) | Field strength × Application time (kV/cm) × (sec) | Heating by heater | Heating temperature (° C.) |
|---|---|---|---|---|---|---|
| Inventive Example 1 | 0.6 | 7 | 170 | 1186 | Yes | 300 |
| Inventive Example 2 | 1.0 | 12 | 60 | 698 | Yes | 300 |
| Inventive Example 3 | 1.0 | 12 | 60 | 698 | Yes | 300 |
| Inventive Example 4 | 1.8 | 21 | 45 | 942 | Yes | 300 |
| Inventive Example 5 | 1.8 | 21 | 45 | 942 | Yes | 300 |
| Inventive Example 6 | 1.8 | 21 | 50 | 1047 | Yes | 300 |
| Inventive Example 7 | 1.8 | 21 | 50 | 1047 | Yes | 300 |
| Inventive Example 8 | 1.8 | 21 | 60 | 1256 | Yes | 300 |
| Inventive Example 9 | 1.8 | 21 | 60 | 1256 | Yes | 300 |
| Inventive Example 10 | 1.8 | 21 | 70 | 1465 | Yes | 300 |
| Inventive Example 11 | 1.8 | 21 | 70 | 1465 | Yes | 300 |
| Inventive Example 12 | 1.8 | 21 | 75 | 1570 | Yes | 300 |
| Inventive Example 13 | 0.5 | 6 | 240 | 1395 | No | Ordinary temperature |
| Inventive Example 14 | 0.8 | 9 | 150 | 1395 | No | Ordinary temperature |
| Inventive Example 15 | 0.8 | 9 | 300 | 2791 | No | Ordinary temperature |
| Inventive Example 16 | 0.8 | 9 | 420 | 3907 | No | Ordinary temperature |

Figure 5:
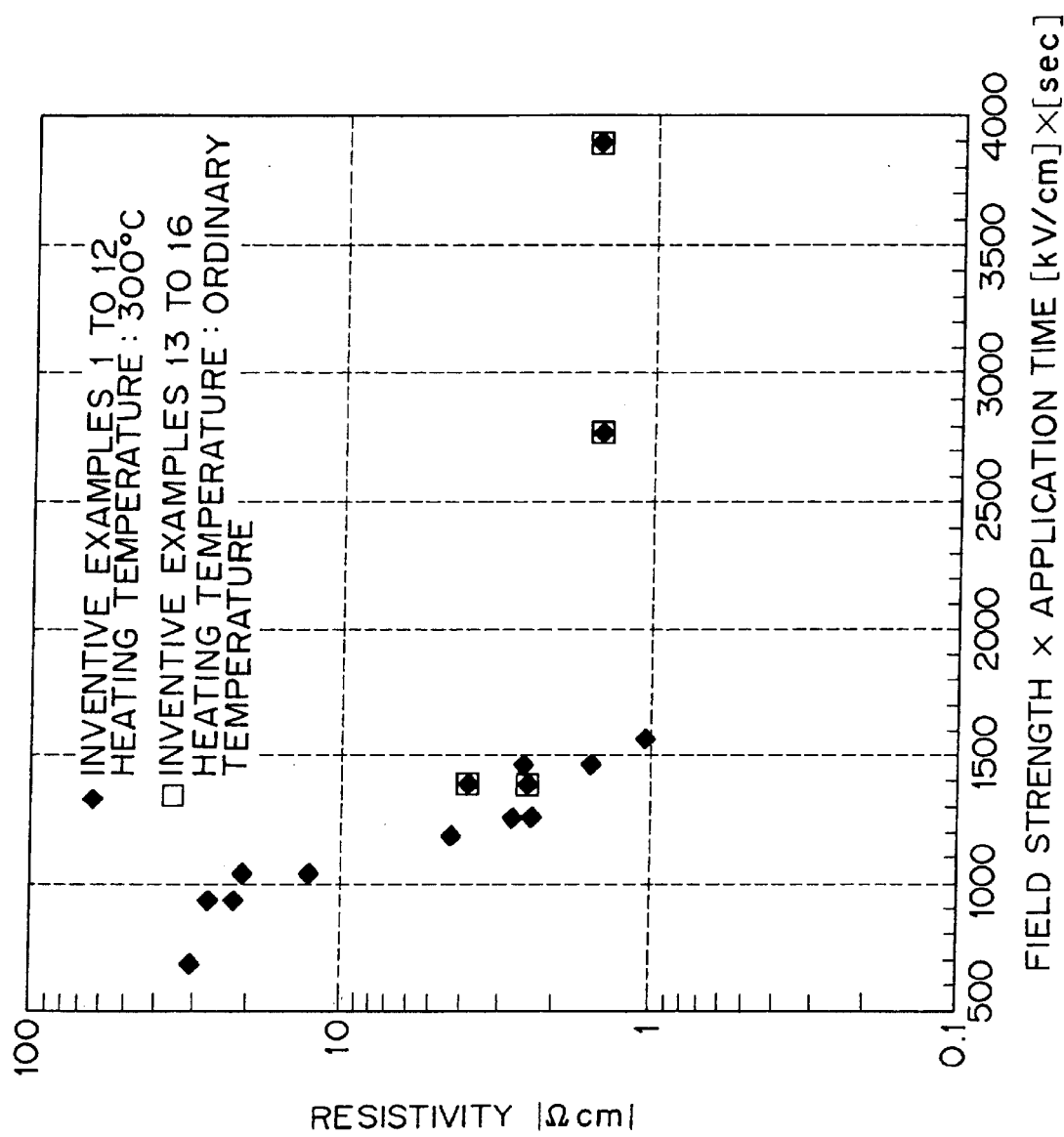
FIG. 5 is a characteristic diagram showing a relationship between resistivity and a field strength×application time for a p-type nitride based III–V compound semiconductor produced in each Inventive Examples.
Figure 6:
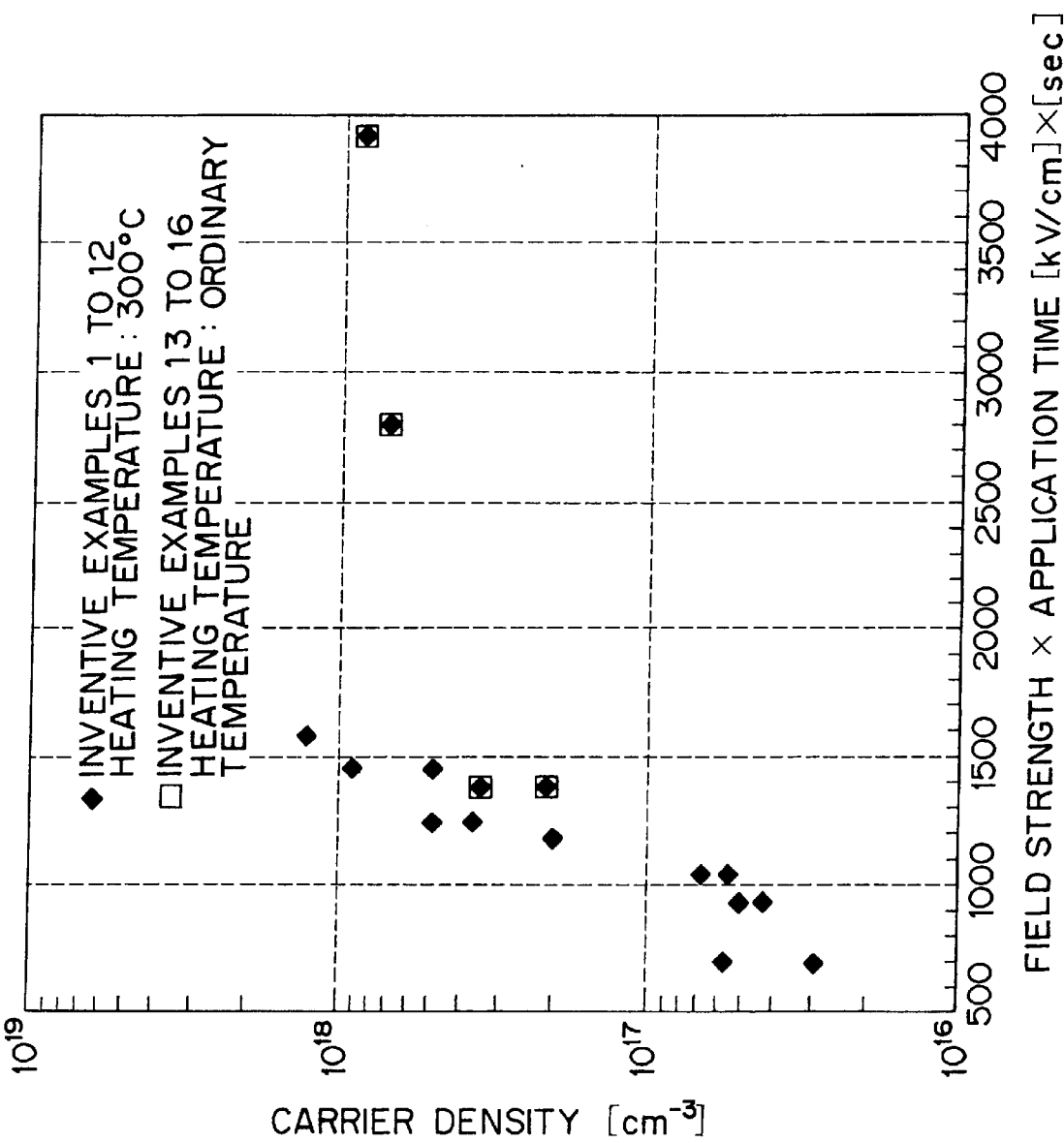
FIG. 6 is a characteristic diagram showing a relationship between resistivity and a carrier density×application time for the p-type nitride based III–V compound semiconductor produced in each Inventive Examples.

Each of the samples in Inventive Examples 1 to 16 was measured in terms of Hall effect by cutting the sample into a size of 5 mm×5 mm and forming electrodes at four corners of the surface of the p-type nitride based III–V compound semiconductor layer of the sample. In addition, the electrode used for the measurement was formed by stacking a nickel (Ni) layer, a platinum layer, and a gold layer in this order from the side of the p-type nitride based III–V compound semiconductor layer. A resistivity, a mobility, and a carrier density of each sample obtained by measurement of the Hall effect is shown in Table 2. Further, the relationship between the resistivity and the field strength×application time (product of the field strength and the application time) is shown in FIG. 5, and the relationship between the carrier density and the field strength×application time is shown in FIG. 6. As is apparent from Table 2, for each of the samples in Inventive Examples 1 to 16, the resistivity is reduced and the carrier density is increased.

TABLE 2

| | Resistivity (Ω cm) | Mobility (cm²/Vs) | Carrier density (cm⁻³) |
|---|---|---|---|
| Inventive Example 1 | 4.27 | 7.28 | $2.01 \times 10^{17}$ |
| Inventive Example 2 | 30.2 | 7.06 | $2.93 \times 10^{16}$ |
| Inventive Example 3 | 31.4 | 3.45 | $5.76 \times 10^{16}$ |
| Inventive Example 4 | 22.4 | 6.55 | $4.25 \times 10^{16}$ |
| Inventive Example 5 | 27 | 4.51 | $5.12 \times 10^{16}$ |
| Inventive Example 6 | 12.9 | 7.17 | $6.77 \times 10^{16}$ |
| Inventive Example 7 | 21 | 5.37 | $5.53 \times 10^{16}$ |
| Inventive Example 8 | 2.33 | 5.45 | $4.92 \times 10^{17}$ |
| Inventive Example 9 | 2.68 | 6.39 | $3.65 \times 10^{17}$ |
| Inventive Example 10 | 1.5 | 4.63 | $9.01 \times 10^{17}$ |
| Inventive Example 11 | 2.47 | 5.13 | $4.92 \times 10^{17}$ |
| Inventive Example 12 | 1.04 | 4.7 | $1.27 \times 10^{18}$ |
| Inventive Example 13 | 2.41 | 7.39 | $3.51 \times 10^{17}$ |
| Inventive Example 14 | 3.79 | 7.71 | $2.14 \times 10^{17}$ |
| Inventive Example 15 | 1.42 | 6.45 | $6.80 \times 10^{17}$ |
| Inventive Example 16 | 1.47 | 5.12 | $8.31 \times 10^{17}$ |

A sample in the Comparative Example was produced in the same manner as described in Inventive Example 1 except that an electrostatic field having a field strength of 70 kV/cm was applied for 10 min in place of an RF field. The sample in the Comparative Example was measured in terms of Hall effect in the same manner as that described in Inventive Example 1. As a result, the activation of a p-type impurity in the sample in the Comparative Example could not be recognized.

The results of Inventive Examples 1 to 16 and the Comparative Example show that the p-type impurity can be easily activated by applying an RF field. The data in FIGS. 5 and 6 show that the resistivity is reduced with an increase in the product of the field strength and the application time and the carrier density is increased with an increase in the product of the field strength and the application time, and that each of the resistivity and the carrier density becomes substantially constant when the product of the field strength and the application time exceeds 1500 (kV/cm)X(sec). Further, from the comparison of the results of Inventive Examples 1 to 12 with those in Inventive Examples 13 to 16, it is apparent that each of the resistivity and the carrier density is not dependent on the heating of the nitrogen based III–V compound semiconductor 84 by the heater 27. That is to say, it is revealed that the p-type impurity can be activated without heating the nitride based III–V compound semiconductor 84 by the heating mechanism, such as the heater 27.

While the present invention has been described with reference to the embodiment and examples, such description is for illustrative purposes only, and it is to be understood that variations may be made without departing from the scope of the present invention. For example, in the above-described embodiment, the RF electrode 23 is brought into contact with the nitride based III–V compound semiconductor 12; however, the RF electrode 23 may be disposed in such a manner as to be spaced from the nitride based III–V compound semiconductor 12.

In the above-described embodiment, hydrogen is allowed to be released from a gap between the nitrogen based III–V compound semiconductor 12 and the RF electrode 23; however, if the surface of the nitrogen based III–V compound semiconductor 12 is flattened and the RF electrode 23 can be brought into tight-contact with the flattened surface of the semiconductor 12, the RF electrode 23 may be made from a hydrogen absorbable or permeable material, or a hydrogen release assisting member made from a hydrogen absorbable or permeable material may be provided on a surface, on the semiconductor 12 side, of the RF electrode 23. With this configuration, even in the case where a gap between the nitrogen based III–V compound semiconductor 12 and the RF electrode 23 is narrow, it is possible to prevent the release of hydrogen from being blocked. Specific examples of the hydrogen absorbable or permeable materials may include an alloy of nickel (Ni) and lanthanum (La) or magnesium (Mg), an alloy of titanium (Ti) and manganese (Mn), iron (Fe), and cobalt (Co) or vanadium (V), an alloy of zinc (Zn) and manganese, an alloy of vanadium, titanium, and chromium (Cr), and palladium (Pd).

In the above-described embodiment, the nitride based III–V compound semiconductor 12 is produced by the MOCVD process; however, the semiconductor 12 may be produced by an MBE (Molecular Beam Epitaxy) process, or a hydride vapor-phase growth process, or halide vapor-phase growth process. The hydride vapor-phase process is characterized in that a hydride contributes to reaction and transfer of a source gas, and the halide vapor-phase growth process is characterized in that a halide contributes to the reaction and transfer of a source gas.

In the above-described embodiment, the substrates 11 and 61 made from sapphire are used; however, the substrate may be made from a material other than sapphire, such as GaN or SiC.

In the above-described embodiment, the method of fabricating a semiconductor device has been described by example of a semiconductor laser as the semiconductor device; however, the present invention can be applied to a method of fabricating another semiconductor device using a p-type nitride based III–V compound semiconductor, such as a light emitting diode or a hetero-junction bipolar transistor (HBT).

What is claimed is:

1. A method of producing a p-type nitride based III–V compound semiconductor, comprising the steps of:
   preparing a nitride based III–V compound semiconductor containing at least one kind selected from group IIIB elements, at least nitrogen selected from group VB elements, and a p-type impurity; and
   applying a radio frequency field to said nitride based III–V compound semiconductor.

2. A method of producing a p-type nitride based III–V compound semiconductor according to claim 1, whereas hydrogen (H) is released from said nitride based III–V compound semiconductor by applying a radio frequency field to said compound semiconductor.

3. A method of producing a p-type nitride based III–V compound semiconductor according to claim 1, wherein a frequency of the radio frequency field to be applied to said compound semiconductor is in a range of 100 GHz or less.

4. A method of producing a p-type nitride based III–V compound semiconductor according to claim 1, wherein a field strength of the radio frequency field to be applied to said compound semiconductor is in a range of 100 V/cm to 1.5 MV/cm.

5. A method of producing a p-type nitride based III–V compound semiconductor according to claim 1, wherein the radio frequency field is applied to said compound semiconductor under a reduced pressure; a normal pressure, or an increased pressure of $1\times10^6$ Pa or less.

6. A method of fabricating a semiconductor device, comprising the step of: producing a p-type nitride based III–V compound semiconductor by preparing a nitride based III–V compound semiconductor containing at least one kind selected from group IIIB elements, at least nitrogen selected from group VB elements, and a p-type impurity and applying a radio frequency field to said nitride based III–V compound semiconductor thus prepared.

* * * * *

UNITED STATES PATENT AND TRADEMARK OFFICE
CERTIFICATE OF CORRECTION

PATENT NO. : 6,524,882 B2 Page 1 of 1
DATED : February 25, 2003
INVENTOR(S) : Motonobu Takeya et al.

It is certified that error appears in the above-identified patent and that said Letters Patent is hereby corrected as shown below:

Column 10,
Line 56, replace "I11-V" with -- III-V --.

Signed and Sealed this

Twenty-fifth Day of November, 2003

JAMES E. ROGAN
*Director of the United States Patent and Trademark Office*